United States Patent
Yonezu et al.

(10) Patent No.: US 8,598,680 B2
(45) Date of Patent: Dec. 3, 2013

(54) SEMICONDUCTOR DEVICE WITH ELECTRICAL FUSE

(75) Inventors: Toshiaki Yonezu, Kanaawa (JP); Takeshi Iwamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 110 days.

(21) Appl. No.: 13/047,844

(22) Filed: Mar. 15, 2011

(65) Prior Publication Data

US 2011/0248379 A1 Oct. 13, 2011

(30) Foreign Application Priority Data

Apr. 8, 2010 (JP) ................... 2010-089405

(51) Int. Cl.
*H01L 23/52* (2006.01)
(52) U.S. Cl.
USPC ................... 257/529; 257/E23.149
(58) Field of Classification Search
USPC ................... 257/209, 529
See application file for complete search history.

(56) References Cited

U.S. PATENT DOCUMENTS

| 2003/0209734 A1* | 11/2003 | Kothandaraman | 257/209 |
| 2005/0067670 A1* | 3/2005 | Hui | 257/529 |
| 2005/0285224 A1* | 12/2005 | Tsutsui | 257/531 |
| 2007/0090486 A1 | 4/2007 | Otsuka et al. | |

FOREIGN PATENT DOCUMENTS

JP  2007-73576 A  3/2007

\* cited by examiner

*Primary Examiner* — Howard Weiss
*Assistant Examiner* — Bilkis Jahan
(74) *Attorney, Agent, or Firm* — Mattingly & Malur, PC

(57) ABSTRACT

A semiconductor device having an electrical fuse which is cut in a reliable manner and a method for manufacturing it. The electrical fuse is a multilayer structure which includes a polysilicon film and a metal silicide film such as a tungsten silicide film. By applying an electric current with a density of 40 mA/$\mu$m$^3$ or more to the electrical fuse with a prescribed length, the fuse is cut by electromigration and a pinch effect in a reliable manner.

9 Claims, 18 Drawing Sheets

PHOTO 3 CURRENT DENSITY=43mA/μm³

PHOTO 4 CURRENT DENSITY=38mA/μm³

SEMICONDUCTOR DEVICE WITH ELECTRICAL FUSE

CROSS-REFERENCE TO RELATED APPLICATIONS

The disclosure of Japanese Patent Application No. 2010-89405 filed on Apr. 8, 2010 including the specification, drawings and abstract is incorporated herein by reference in its entirety.

BACKGROUND

The present invention relates to a semiconductor device and a method for manufacturing the same and more particularly to a semiconductor device with an electrical fuse and a method for manufacturing the same.

In the past, laser trimming has been known as a technique for repairing a defective circuit in a semiconductor device manufacturing process, in which the defective circuit is switched to a previously prepared backup redundant circuit. Laser trimming is performed by irradiating a fuse on a wafer with laser light. More specifically, the circuit is repaired by melting a specific fuse among plural fuses as polysilicon or metal wires by laser irradiation.

In recent years, with the increasing tendency towards highly functional systems or large capacity memories, there has been a demand for semiconductor devices called SIP (System In Package) in which a plurality of semiconductor chips are housed in one package. In this type of semiconductor device (SIP), in order to increase the yield in final testing after laser trimming, it is necessary to make a repair after molding of the semiconductor chips. However, if laser trimming is performed on the wafer, it is difficult to make a repair after molding of the semiconductor chips. In addition, a special device for cutting (blowing) fuses is needed in laser trimming.

Therefore, there is an increasing need for an electrical fuse which is cut not by laser irradiation but by applying current to it. Among documents which disclose such electrical fuses is Japanese Unexamined Patent Publication No. 2007-73576. In the technique disclosed therein, since an electrical fuse is cut by applying current to it using the internal power supply in a semiconductor chip, it can be cut in an on-wafer state even after molding.

In the past, polysilicon wires, which are widely used for interconnect wires in semiconductor devices, have been adopted for electrical fuses. A polysilicon wire electrical fuse is cut by electromigration. More specifically, when current is applied to the electrical fuse, metal silicide migration occurs and the resistance of the fuse changes. While the resistance before cutting is 100 to 200 ohms, the resistance after cutting is in the range of several kilo-ohms to several mega-ohms and one-to-four digit higher than before cutting.

SUMMARY

However, the existing electrical fuse has the following problem. In the case of laser trimming which cuts the fuse by laser irradiation, the fuse resistance after cutting is 1 mega-ohm or more and the resistance variation is relatively small. Therefore, the threshold which is used for the decision circuit to decide whether the fuse has been cut or not can be in the mega-ohm order, so the load on the decision circuit can be reduced and the size of the decision circuit can be decreased.

On the other hand, in the case of an electrical fuse, electromigration is used to cause metal silicide migration, so the fuse resistance after cutting is in the range of several kilo-ohms to several mega-ohms and the resistance variation (range) is large. Therefore, the threshold for the decision circuit must be set to several kilo-ohms or so and this restricts downsizing of the decision circuit, namely the circuit must have a certain size. Another problem is that the resistance of a cut fuse after reliability testing of the semiconductor device decreases.

The present invention has been made in order to address the above problems and one object thereof is to provide a semiconductor device with an electrical fuse which is cut in a reliable manner and another object is to provide a method for manufacturing the semiconductor device.

The semiconductor device according to the present invention includes a semiconductor substrate having a main surface, a plurality of electrical fuses, and an insulating film. The electrical fuses are formed over the main surface of the semiconductor substrate and each include a multilayer film with a metal silicide film lying over a polysilicon film and they are cut by applying a prescribed current. The insulating film is formed over the semiconductor substrate so as to cover the electrical fuses. In a cut electrical fuse among the electrical fuses, both the metal silicide film and the polysilicon film are cut and in an uncut electrical fuse among them, neither the metal silicide film nor the polysilicon film is cut.

The method for manufacturing a semiconductor device according to the present invention includes the following steps. A wafer as a semiconductor substrate is prepared. An internal circuit with a prescribed functionality is formed on the main surface of the wafer. A trimming circuit for repairing the internal circuit is formed. A wafer test is conducted to test the internal circuit in an on-wafer state. A semiconductor chip obtained by dicing the wafer is encapsulated into a prescribed package. A final test is conducted to test the internal circuit in a packaged state. The step of forming the trimming circuit includes a step of forming a plurality of electrical fuses having a multilayer with a metal silicide film lying over a polysilicon film. At least either the step of conducting the wafer test or the step of conducting the final test includes a step of cutting a specific electrical fuse among the electrical fuses in which by applying current to the specific electrical fuse, an air gap is formed in a given place of the specific electrical fuse to cut both the metal silicide film and the polysilicon film.

The semiconductor device according to the present invention includes electrical fuses which each have a multilayer film with a metal silicide film lying over a polysilicon film and are cut by applying a prescribed current. In a cut electrical fuse, both the metal silicide film and the polysilicon film are cut and in an uncut electrical fuse, neither the metal silicide film nor the polysilicon film is cut. This reduces the variation in the electrical fuse resistance after cutting and improves reliability and also makes it possible to attain a giga-ohm order resistance, thereby allowing downsizing of the decision circuit.

DETAILED DESCRIPTION

First Embodiment

Figure 1:
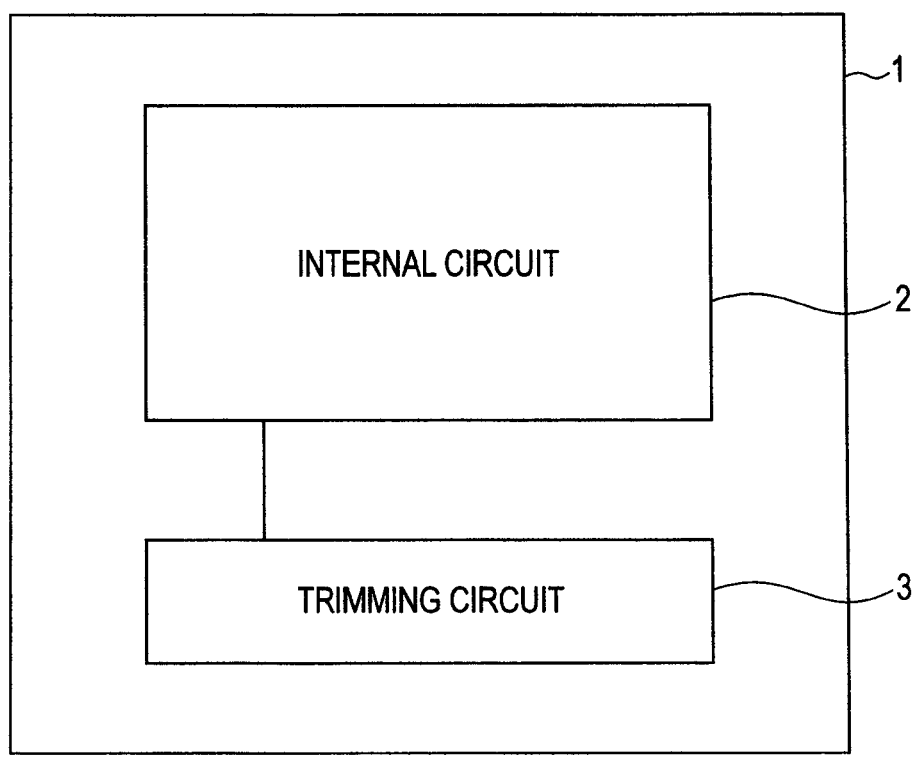
FIG. 1 a block diagram of a semiconductor device according to a first embodiment of the present invention.

A semiconductor device with an electrical fuse according to the first embodiment of the present invention is described below. As shown in FIG. 1, the semiconductor device 1 includes an internal circuit 2 which performs a prescribed function and a trimming circuit 3 which repairs the internal circuit 2. The internal circuit 2 incorporates prescribed semiconductor elements such as a central processing unit (CPU) and a memory. An electrical fuse is formed in the trimming circuit 3.

Figure 2:
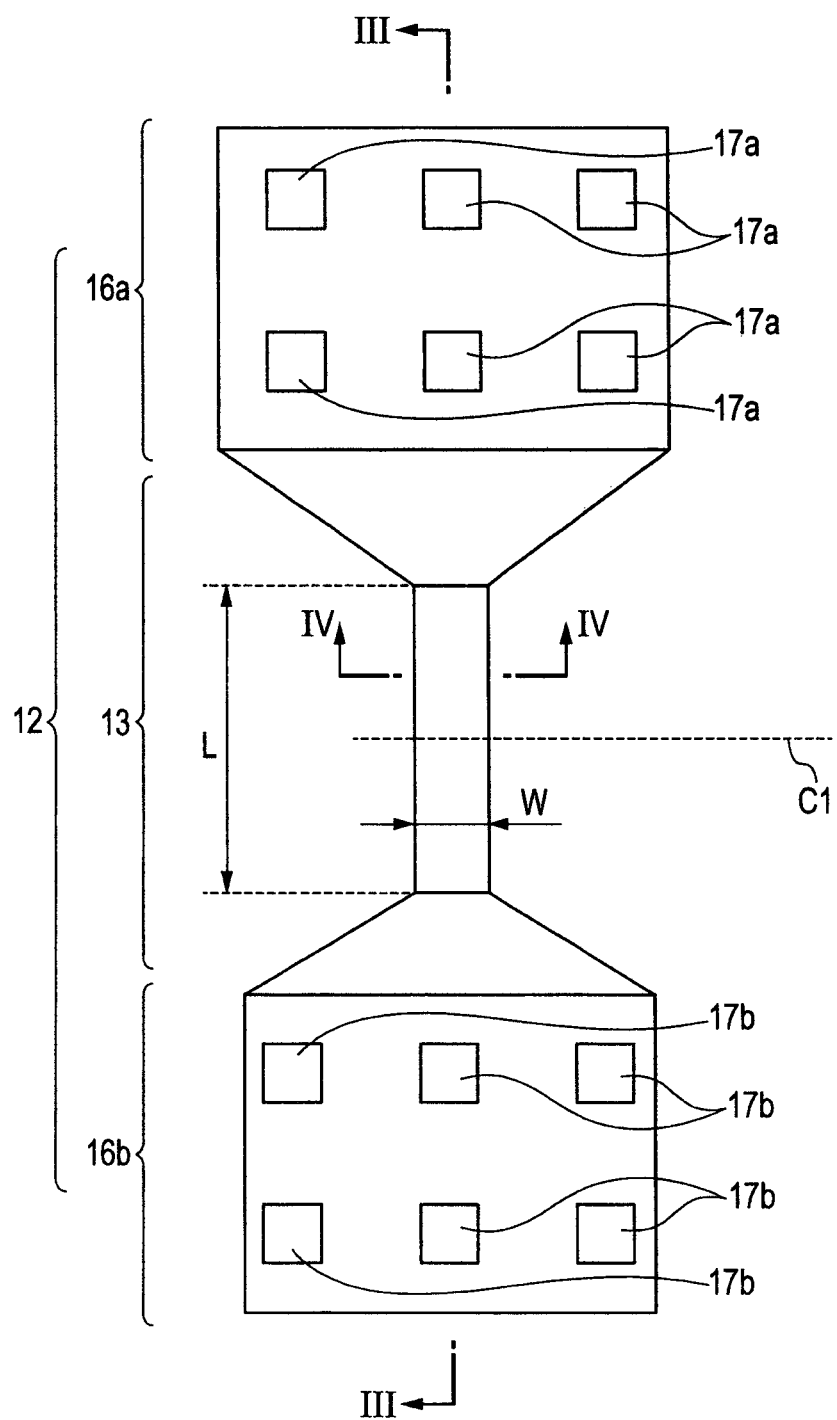
FIG. 2 is a plan view of an electrical fuse in the first embodiment.

Next, an electrical fuse will be described in detail. As shown in FIG. 2, the electrical fuse includes a fuse body 13, a first fuse pad 16a to be coupled to the supply voltage and a second fuse pad 16b to be coupled to the grounding potential. The fuse body 13 has length L in the direction in which current flows and width W in the direction almost perpendicular to the Current flow direction. Plugs 17a are coupled to the first fuse pad 16a and plugs 17b are coupled to the second fuse pad 16b.

The electrical fuse 12 has a plane pattern that it is linearly symmetrical with respect to line segment C1 as the symmetry (center) axis perpendicular to the longitudinal side at the center of the longitudinal side of the fuse body 13. Also, the plugs 17a and 17b are symmetrical with each other with respect to the line segment C1.

Figure 3:
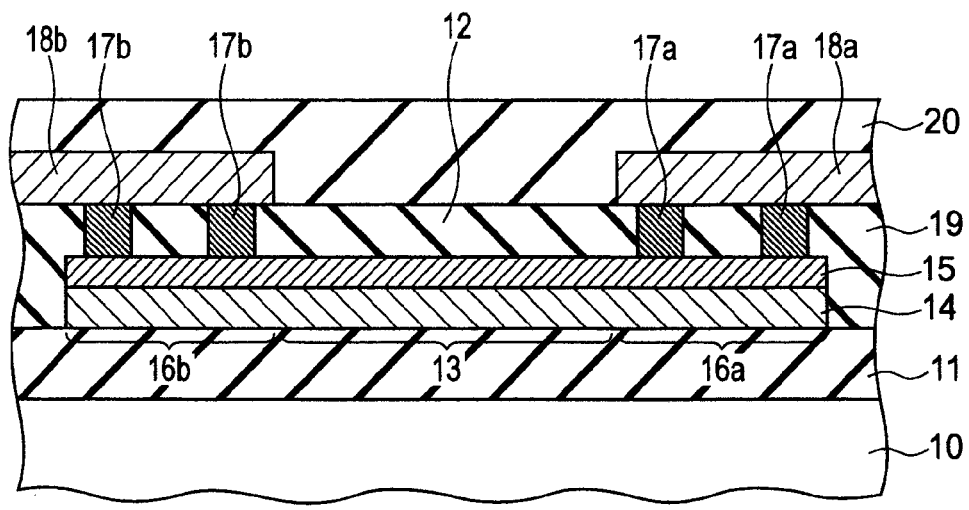
FIG. 3 is a sectional view taken along the line in FIG. 2 in the first embodiment.
Figure 4:
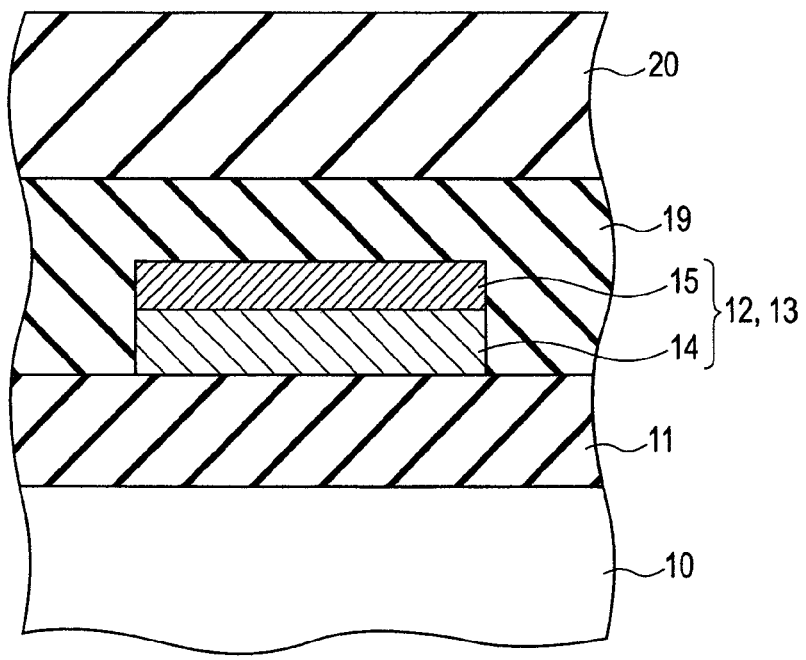
FIG. 4 is a sectional view taken along the line IV-IV in FIG. 2 in the first embodiment.

As shown in FIGS. 3 and 4, the electrical fuse 12 has a multilayer structure (polycide structure) which includes a polysilicon film 14 and a metal silicide film (for example, a tungsten silicide film) 15. In the semiconductor device, the electrical fuse 12 is formed directly on the surface of a LOCOS (Local Oxidation of Silicon) oxide film 11 formed over the main surface of a semiconductor substrate 10 and a silicon oxide film 19 is formed in a way to cover the electrical fuse 12. Over the surface of the silicon oxide film 19, a metal interconnect 18a coupled to a prescribed supply voltage and a metal interconnect 18b coupled to a grounding potential are formed. The metal interconnect 18a and the first fuse pad 16a are electrically coupled through the plugs 17a. The metal interconnect 18b and the second fuse pad 16b are electrically coupled through the plugs 17b. A passivation film 20 is formed in a way to cover the metal interconnects 18a and 18b.

As a result of various tests, the inventors have found that due to electromigration and a pinch effect the above electrical fuse is cut in a reliable manner when the current density is 40 mA/$\mu m^3$ or more and the fuse (body) length is 4 μm or more.

Figure 5:
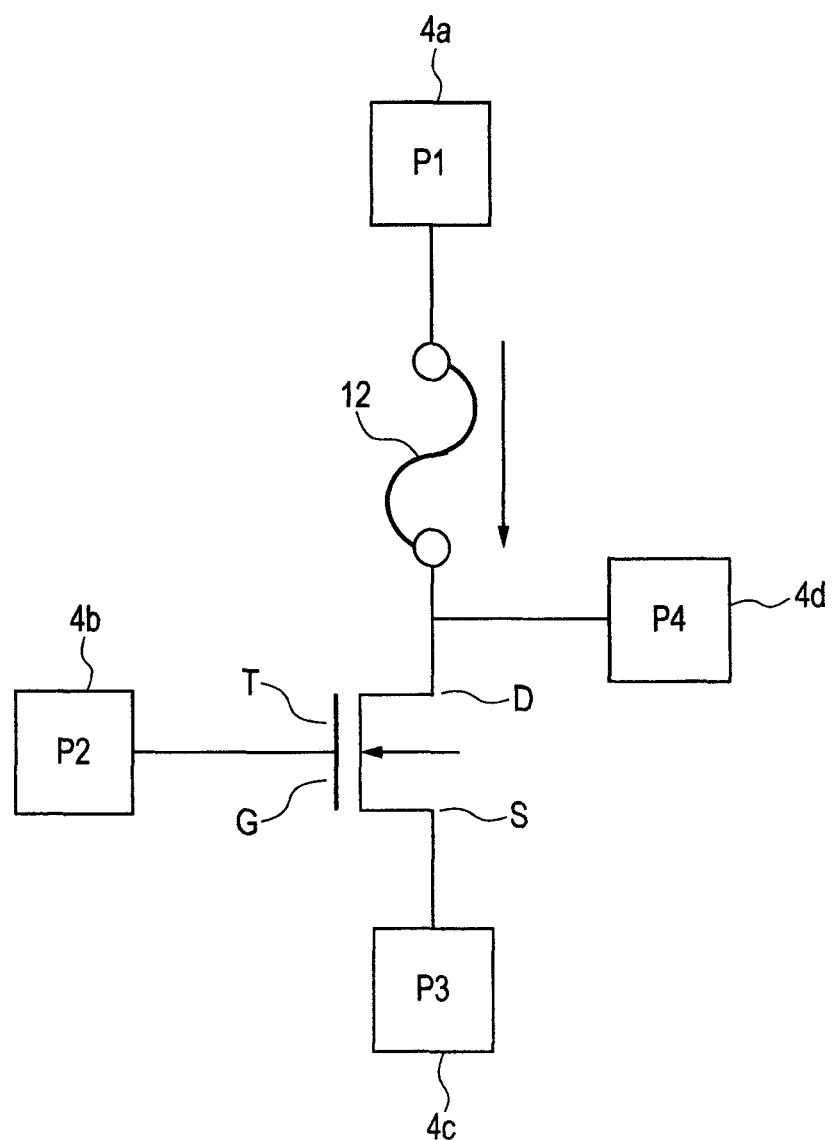
FIG. 5 is a circuit diagram showing an electrical fuse and its vicinity to evaluate the electrical fuse in the first embodiment.

Specifically, the test results are analyzed as follows. First, the electrical fuse used for the tests is described below. As shown in FIG. 5, a transistor T for fuse cutting is provided as a switching element for applying current to the electrical fuse 12. The electrical fuse 12 is coupled to and between the drain D of the transistor T for fuse cutting and the pad 4a to which supply voltage (Vdd) is applied. The source S of the transistor T is coupled to the pad 4c to which grounding potential (GND) is applied. The gate G of the transistor T is coupled to the pad 4b to which a voltage not lower than a given threshold voltage is applied to turn on the transistor T. The drain D of the transistor T is coupled to pad 4d. The resistance of the electrical fuse 12, etc is measured by letting a probe touch a specific one among the pads 4a to 4d.

In the tests, the inventors measured the resistances of electrical fuses with different lengths before and after cutting to know the change in resistance as follows. The inventors prepared electrical fuses of 0.5 μm in width W and 1 μm, 2 μm, 4 μm, and 6 μm in length L. The supply voltage Vdd was 5.5 V and the voltage Vg applied to the gate G (FIG. 2) of the transistor T for fuse cutting was 3.5 V. The resistances of the electrical fuses before and after cutting were measured.

The measurement results are shown in FIGS. 6 to 9. The figures indicate that the resistance before fuse cutting (program) is in the range of 100 to 200 ohms. It has been confirmed that after supply voltage (Vdd=5.5 V) was applied to the electrical fuses and the fuses were cut, the fuse resistance varied depending on the fuse length L.

Figure 6:
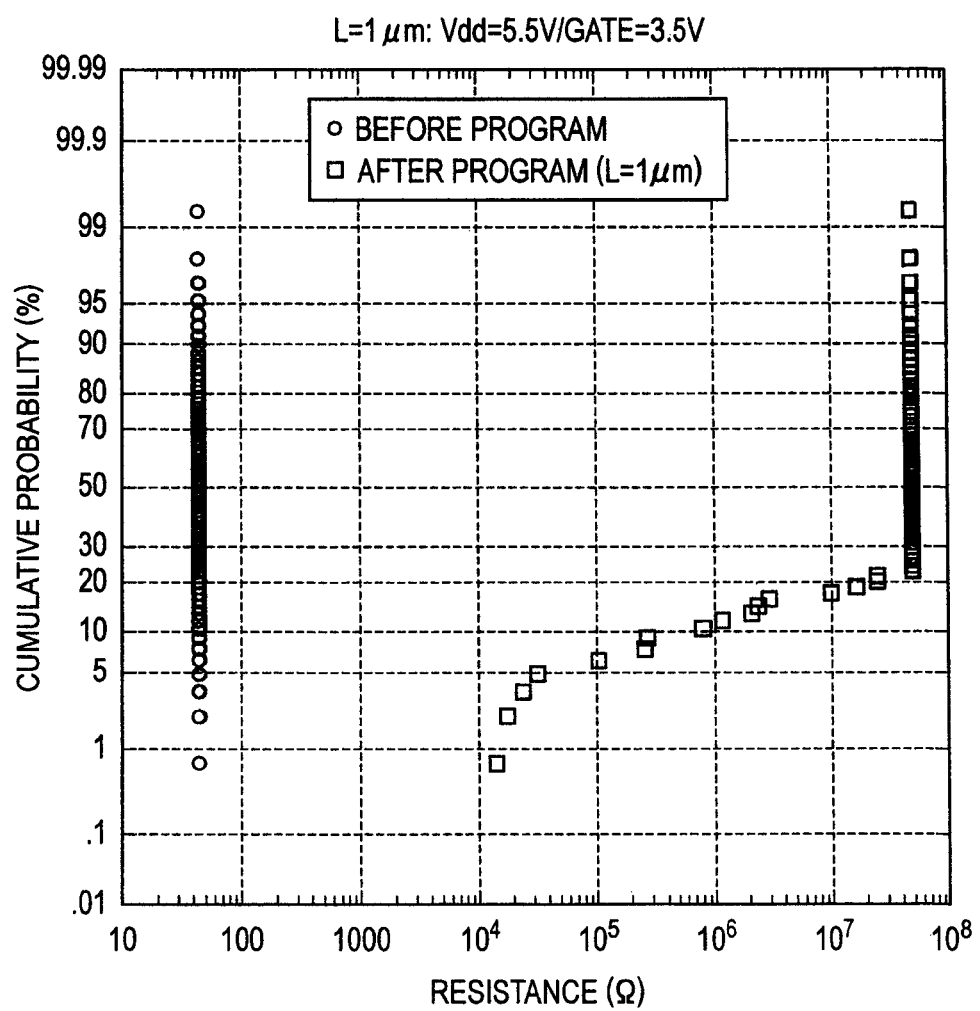
FIG. 6 is a first graph showing the change in the resistances of electrical fuses before and after cutting of the electrical fuses in the first embodiment.
Figure 7:
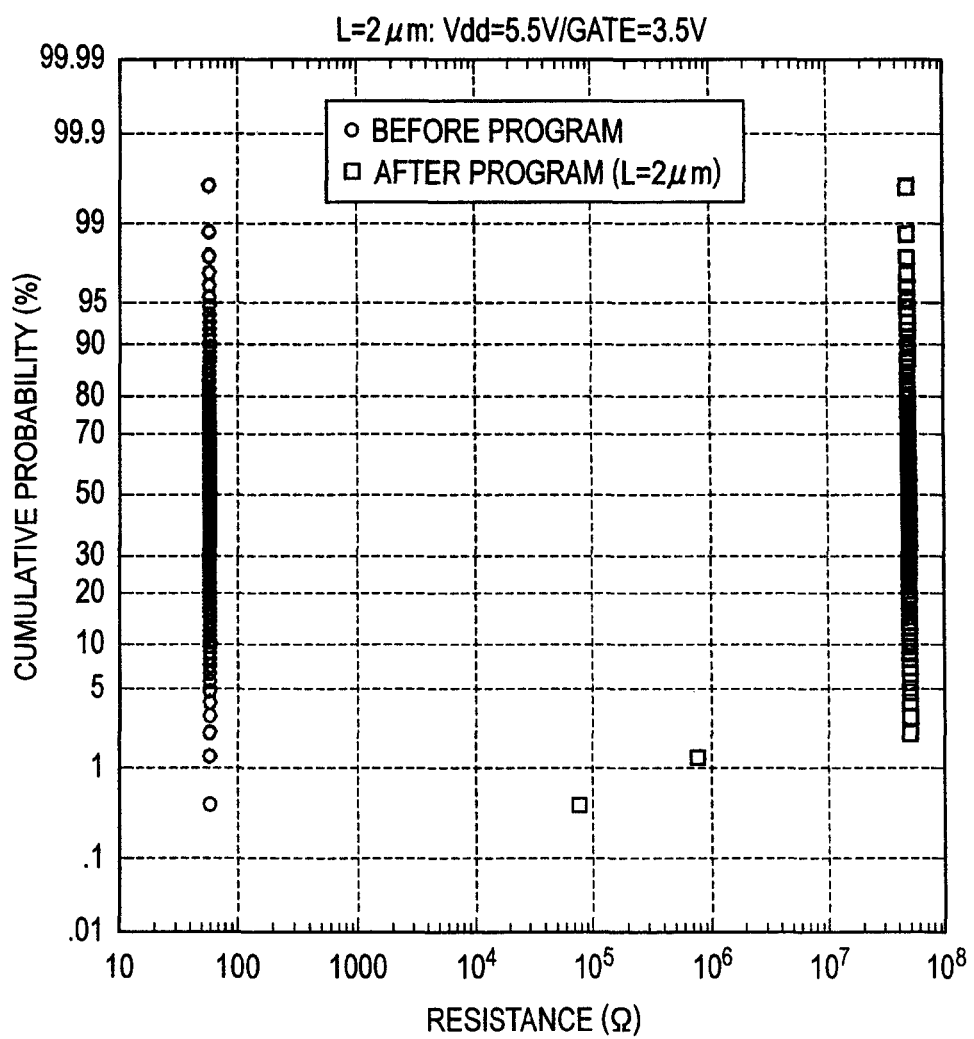
FIG. 7 is a second graph showing the change in the resistances of electrical fuses before and after cutting of the electrical fuses in the first embodiment.
Figure 8:
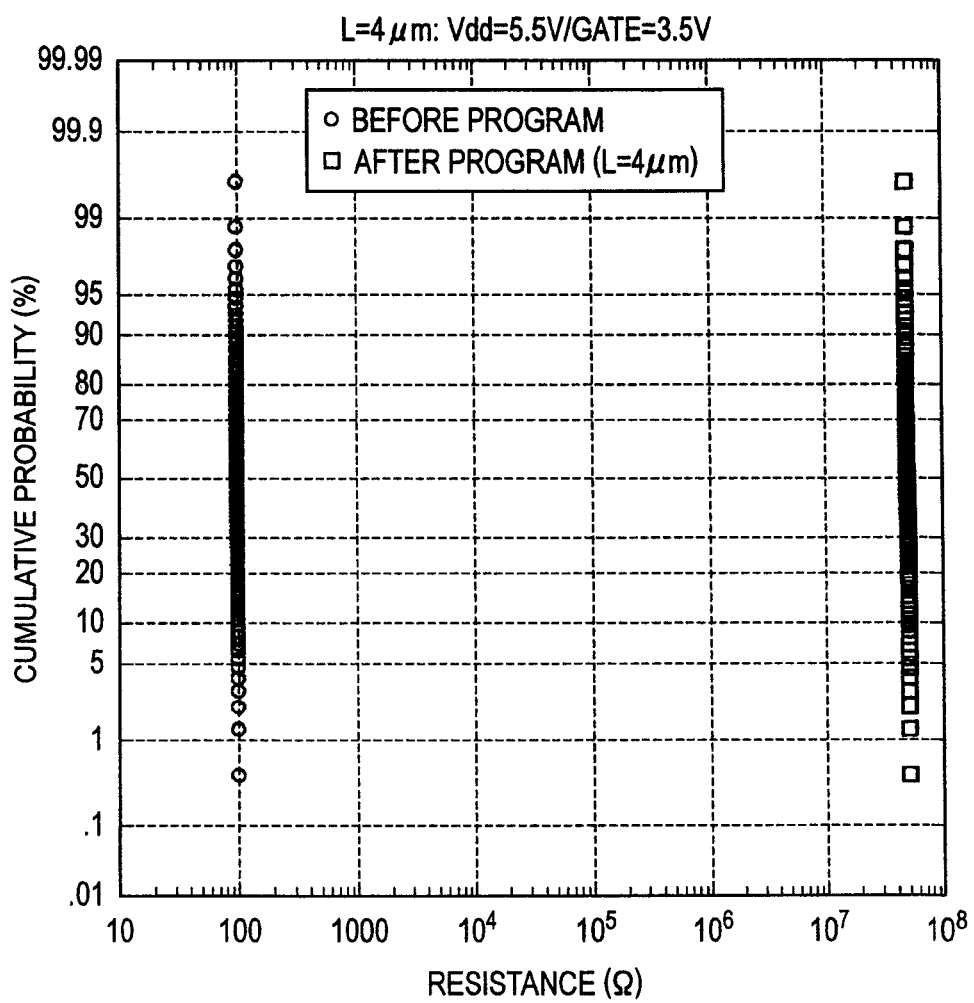
FIG. 8 is a third graph showing the change in the resistances of electrical fuses before and after cutting of the electrical fuses in the first embodiment.
Figure 9:
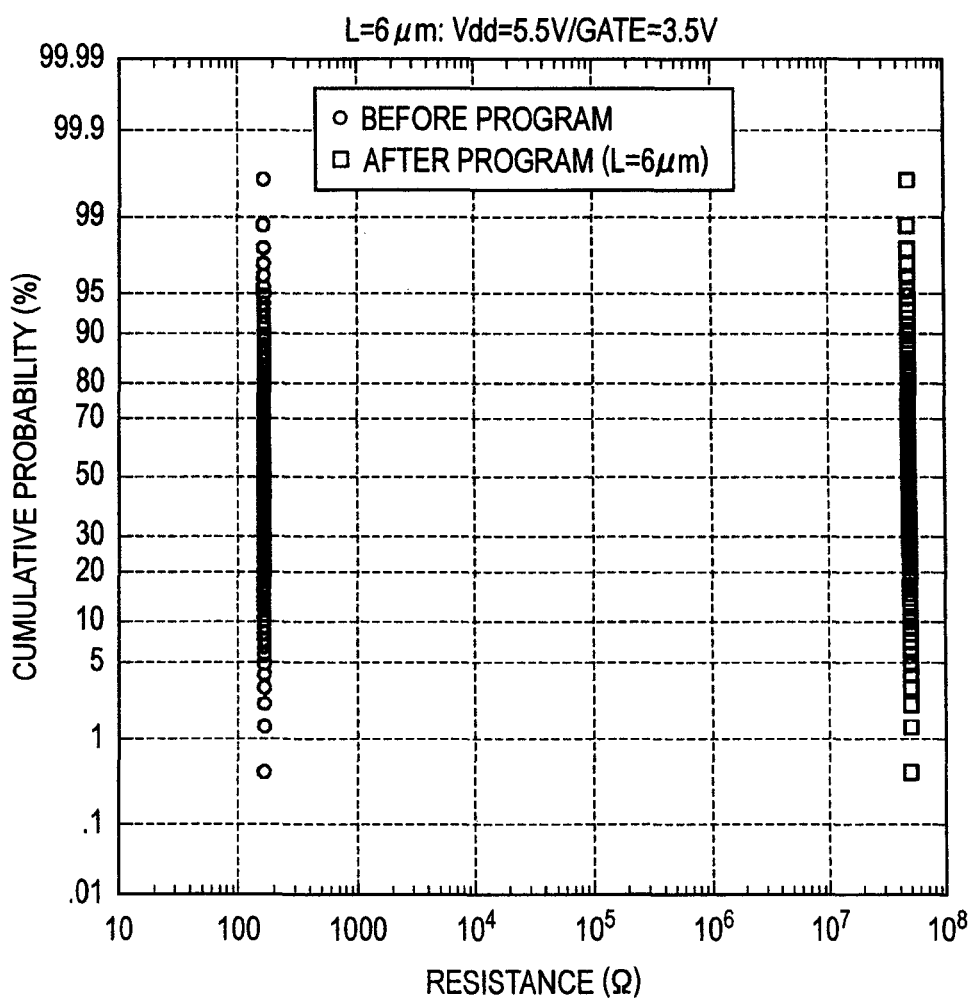
FIG. 9 is a fourth graph showing the change in the resistances of electrical fuses before and after cutting of the electrical fuses in the first embodiment.

As FIGS. 6 and 7 indicate, it has been found that among electrical fuses with length L of 1 μm and those with length L of 2 μm, some fuses did not reach $10^7$ ohms or so in resistance and were not cut completely. On the other hand, as FIGS. 8 and 9 indicate, it has been found that in the case of electrical fuses with length L of 4 μm and those with length L of 6 μm, all fuses reached $10^7$ ohms or so and were cut completely. These results demonstrate that it is desirable to use electrical fuses with a length of 4 μm or more.

The resistance value ($10^7$ ohms or so) in FIGS. 6 to 9 which is assumed to demonstrate that an electrical fuse was cut completely is a value that indicates the measurement limit of a measuring instrument and the inventors confirmed that the actual resistances were in the giga-ohm order.

Figure 10:
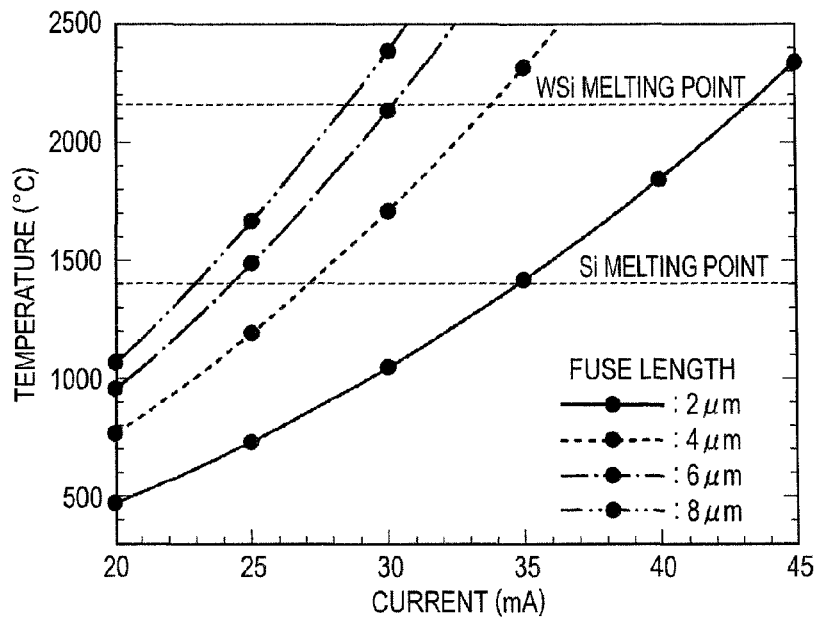
FIG. 10 is a graph showing the relation between the current applied to an electrical fuse and the temperature of the fuse by simulation in the first embodiment.

The inventors further conducted detailed tests in order to ensure that the electrical fuses are cut in a reliable manner. FIG. 10 shows a simulation result which indicates the relation between the current applied to electrical fuses with different lengths (L=2, 4, 6, and 8 μm) and the fuse temperature. As shown in FIG. 10, for example, when the current is 35 mA, the temperature of the fuse with length L of 2 μm (or less) did not reach the melting point of tungsten silicide. The reason may be that when the fuse length is 2 μm or less, even if current is applied so as to attain a prescribed current density, heat dissipates at both ends of the fuse body and the fuse temperature does not reach the melting point of metal silicide.

Figure 11:
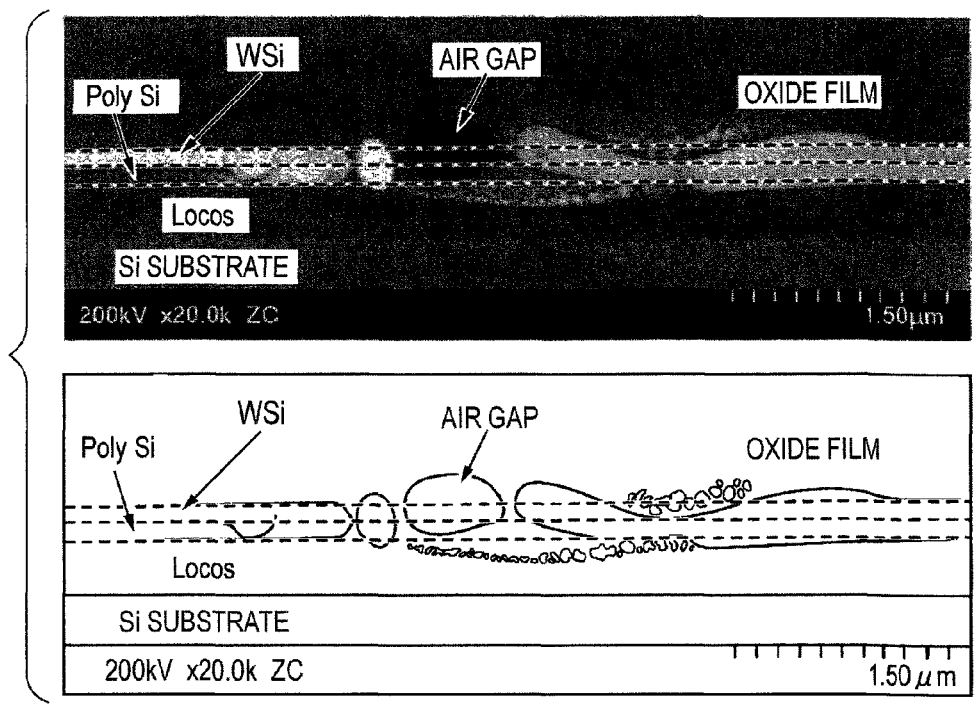
FIG. 11 is a cross-sectional SEM (scanning electronic microscope) photo of a cut in an electrical fuse and its vicinity combined with a sectional view created by tracing the SEM photo in the first embodiment.

On the other hand, in the case of an electrical fuse with length L of 4 μm or more, it has been found that the fuse temperature exceeds the melting point of tungsten silicide. As for the above electrical fuse of the semiconductor device, it has been found that the fuse temperature exceeds the melting temperature of tungsten silicide and the metal silicide melts and an air gap is formed in the fuse body, so the fuse is cut in a reliable manner. FIG. 11 is an electron micrograph showing an electrical fuse with such an air gap formed therein in enlarged form, combined with a view created by tracing the micrograph. As FIG. 11 indicates, an air gap is formed in a given place of the fuse body by electromigration and a pinch effect. The mechanism of electrical fuse cutting will be explained in detail later.

Next, the relation between the position of the air gap in the fuse body and the density of current applied to the electrical fuse will be described. The inventors prepared electrical fuses with length L of 6 μm and set the current density to 53 mA/μm$^3$, 48 mA/μm$^3$, 43 mA/μm$^3$, and 38 mA/μm$^3$ to cut the fuses. Cross sections of the cut fuses were observed through an electron microscope. The observed cross sections are shown in FIGS. 12, 13, 14, and 15 respectively.

Figure 12:
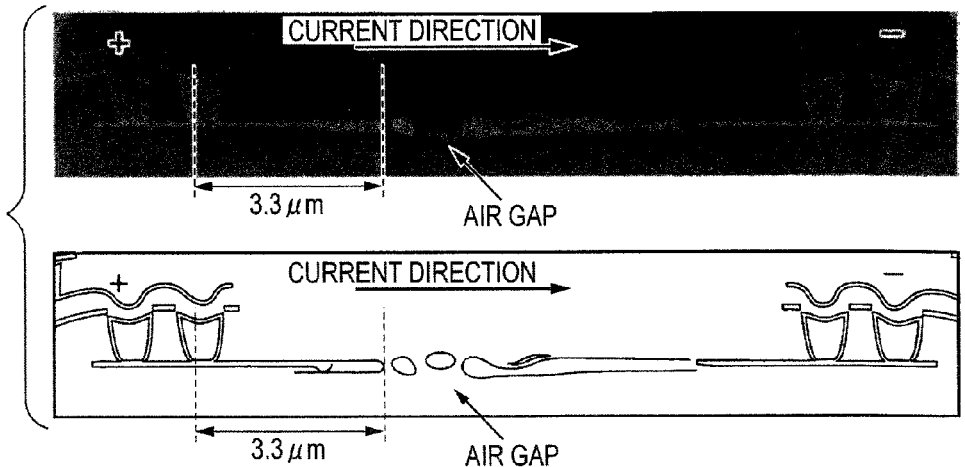
FIG. 12 is a first cross-sectional SEM photo of a cut in an electrical fuse and its vicinity for the evaluation of the dependence of electrical fuse cut on current density, combined with a sectional view created by tracing the first cross-sectional SEM photo in the first embodiment.
Figure 13:
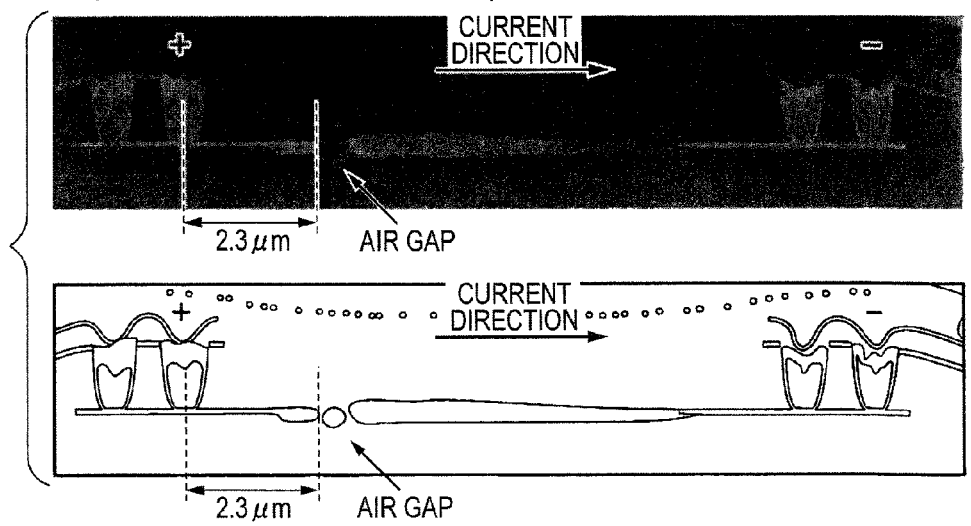
FIG. 13 is a second cross-sectional SEM photo of a cut in an electrical fuse and its vicinity for the evaluation of the dependence of electrical fuse cut on current density, combined with a sectional view created by tracing the second cross-sectional SEM photo in the first embodiment.
Figure 14:
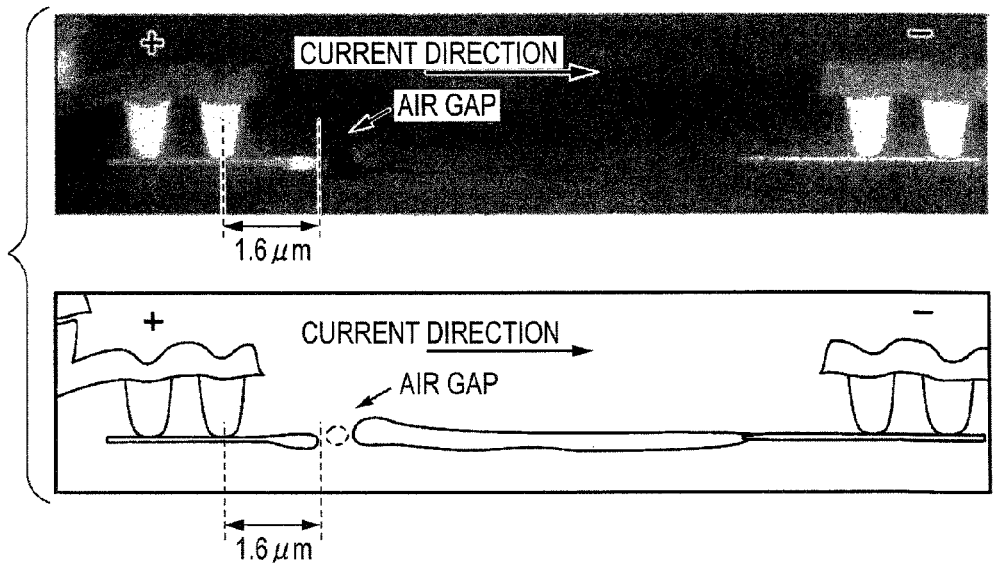
FIG. 14 is a third cross-sectional SEM photo of a cut in an electrical fuse and its vicinity for the evaluation of the dependence of electrical fuse cut on current density, combined with a sectional view created by tracing the third cross-sectional SEM photo in the first embodiment.

As shown in FIG. 12, it has been found that when the current density is 53 mA/μm$^3$, an air gap is formed at a position approximately 3.3 μm from the positive pole. As shown in FIG. 13, it has been found that when the current density is 48 mA/μm$^3$, an air gap is formed at a position approximately 2.3 μm from the positive pole. As shown in FIG. 14, it has been found that when the current density is 43 mA/μm$^3$, an air gap is formed at a position approximately 1.6 μm from the positive pole.

Figure 15:
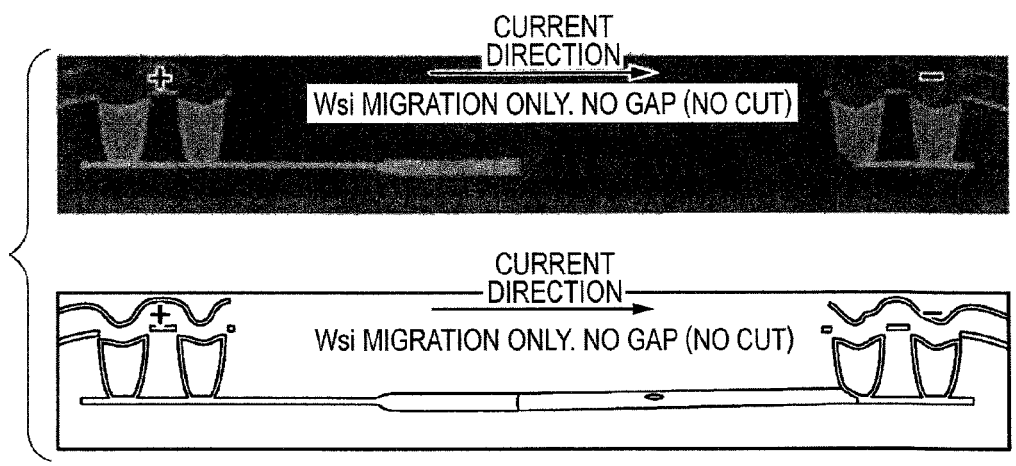
FIG. 15 is a fourth cross-sectional SEM photo of a cut in an electrical fuse and its vicinity for the evaluation of the dependence of electrical fuse cut on current density, combined with a sectional view created by tracing the fourth cross-sectional SEM photo in the first embodiment.

Thus it has been found that as the density of current applied to the electrical fuse decreases, the position of an air gap shifts in the direction from the center to the end. When the current density is the lowest, as illustrated in FIG. 15 (current density=38 mA/μm$^3$), no air gap is formed in the fuse body, migration of metal silicide only occurs. These results suggest that the position of an air gap can be controlled by the density of current applied to the electrical fuse, which will be explained later.

Next, the high-temperature storage test which was conducted to evaluate the reliability of the semiconductor device will be described. For the test, the inventors prepared electrical fuses with an air gap clearly formed therein (electrical fuse equivalent to the one shown in FIG. 12) and electrical fuses in which no gap was formed and migration occurred only in the metal silicide film (electrical fuse equivalent to the one shown in FIG. 15) and measured their resistances. Then the electrical fuses were stored at 150 degrees Celsius for different time periods (24, 48, 96, 240, and 500 hours) and after that, the resistances of the electrical fuses were measured and compared with the resistances measured before the high temperature storage. The test results are shown in FIG. 16 and FIG. 17.

Figure 16:
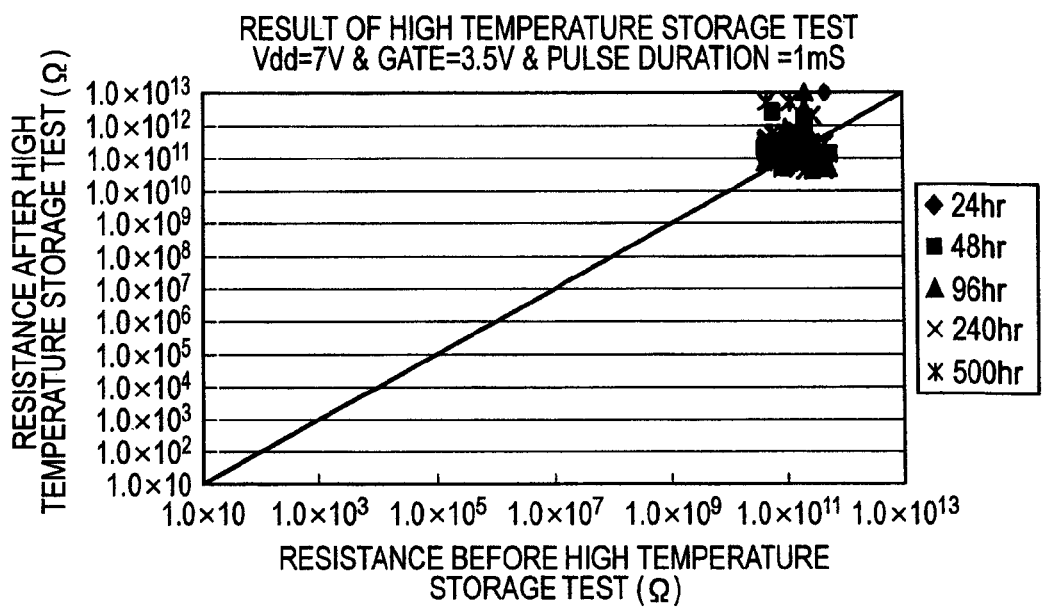
FIG. 16 is a first graph showing the relation between the resistance of a cut electrical fuse measured before high temperature storage test and its resistance measured after the test for the evaluation of the reliability of the cut electrical fuse in the first embodiment.
Figure 17:
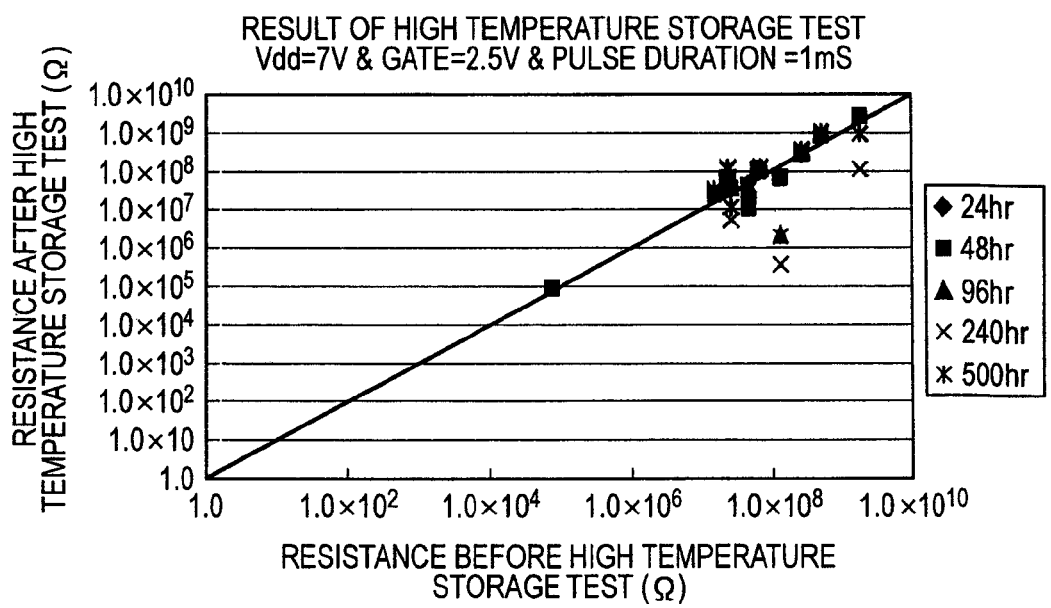
FIG. 17 is a second graph showing the relation between the resistance of a cut electrical fuse measured before high temperature storage test and its resistance measured after the test for the evaluation of the reliability of the cut electrical fuse in the first embodiment.

As shown in FIG. 16, in the case of the electrical fuses with an air gap clearly formed therein, it has been found that their resistances before the high temperature storage test were not so much different from the resistances after the test, regardless of the storage time period. On the other hand, as shown in FIG. 17, in the case of the electrical fuses in which migration occurred only in the metal silicide film, it has been found that their resistances before the high temperature storage test varied considerably and in some fuses, their resistances after the high temperature storage test were lower than the resistances before the test, suggesting a reliability problem. The test results demonstrate that in order to ensure that an electrical fuse is cut in a reliable manner, preferably the current (density) applied to the electrical fuse should be not less than approximately 40 mA/μm$^3$ at which the formation of an air gap is ensured (equivalent to the case shown in FIG. 14).

Based on the above test results, the mechanism of electrical fuse cutting is explained below. First, it should be noted that the current (density) applied to an electrical fuse should be able to increase the temperature to a level at which the metal silicide film melts.

Figure 18:
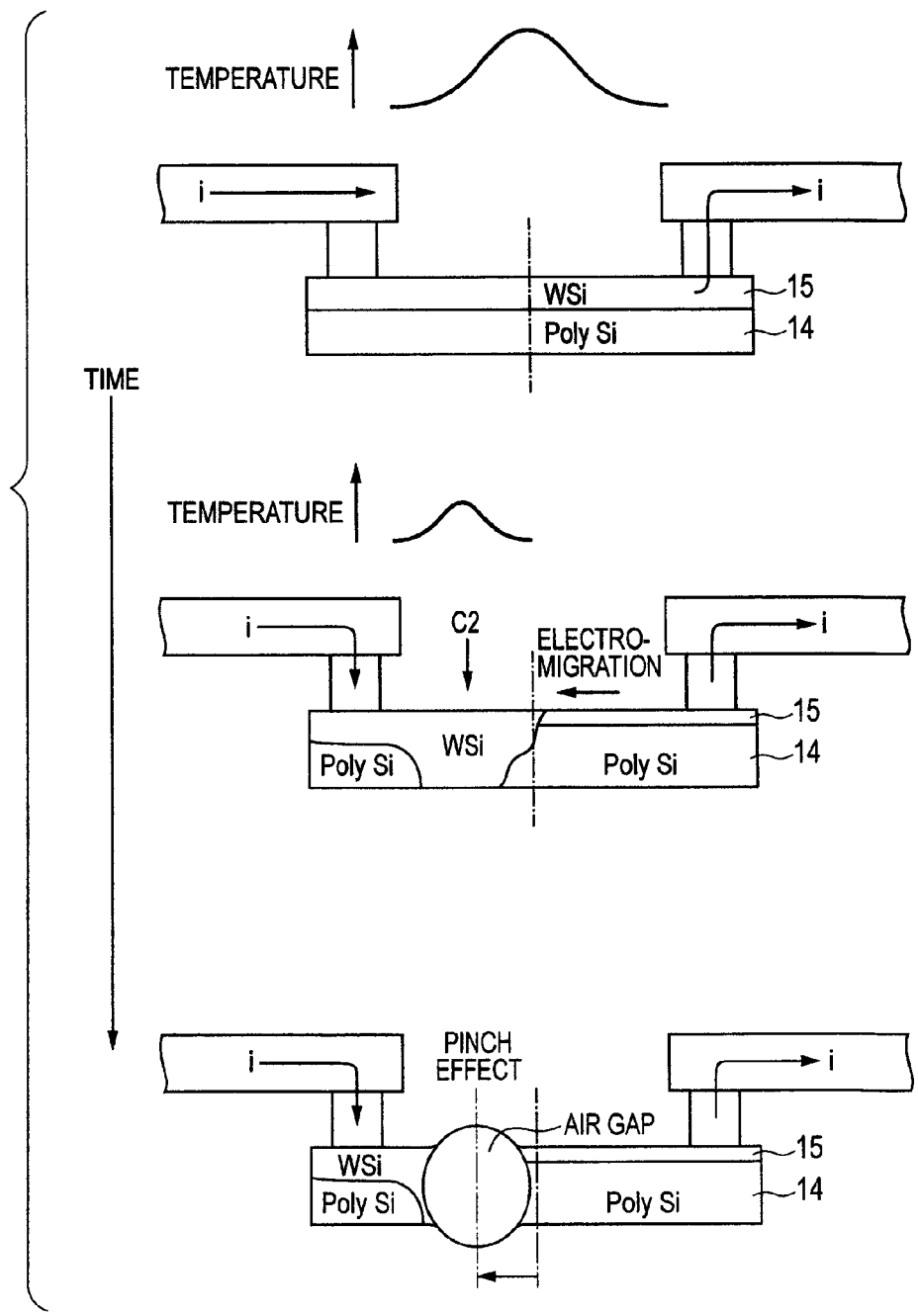
FIG. 18 is a sectional view schematically showing the process in which an electrical fuse is cut in the first embodiment.

As shown in FIG. 18, when there is no electromigration in the metal silicide film, the temperature of the electrical fuse is the highest at the center of the electrical fuse in its longitudinal direction due to a heat sink effect at both ends of the fuse. Actually, however, metal silicide electromigration occurs in the direction opposite to the direction of current, resulting in a distribution of electrical fuse resistances. The current in the electrical fuse most easily flows at the longitudinally central part C2 of the migrated portion of the metal silicide film and the temperature of this part of the metal silicide film reaches the melting point. In other words, the temperature peak shifts from the center of the electrical fuse towards the positive pole side of the fuse as metal silicide migration progresses.

When the temperature of the metal silicide film reaches the melting point, the film melts. As the current flows in the molten metal silicide, due to a pinch effect produced by a Lorentz force, the metal silicide contracts rapidly and causes the fuse to be cut. At this moment, the insulating film (not shown) around the molten metal silicide softens and a virtually spherical air gap will be formed in the electrical fuse by the reactive force generated upon cutting of the fuse. When an air gap is formed in the electrical fuse in this way, the fuse is cut completely (see FIG. 11). The size (diameter) of this spherical air gap is at least approximately 200 nm and at most approximately 1 µm. Here, "spherical" does not mean "mathematically spherical" but means "seemingly spherical".

The time from when the current begins to flow until the temperature of the metal silicide film reaches the melting point depends on the current value and as the current value is lower, the time is longer. Before the temperature of the metal silicide film reaches the melting point, electromigration continues in the metal silicide film due to the current flowing in the electrical fuse. Therefore, the air gap formed in the molten metal silicide is more away from the center of the fuse or nearer to the positive pole when the current value is smaller (see FIGS. 12, 13 and 14).

On the other hand, if the current (density) applied to the electrical fuse cannot increase the temperature to a level at which the metal silicide film melts, the metal silicide film does not melt and no air gap formation due to an pinch effect occurs and only electromigration in the metal silicide film occurs (see FIG. 15). In this case, variation in electrical fuse resistance is observed as mentioned above and the electrical fuse is not cut completely and the fuse reliability is low.

In the semiconductor device with the above electrical fuse, the fuse is a multilayer structure which includes a polysilicon film and a metal silicide film and the fuse is cut by forming an air gap in a given part of the fuse by electromigration and a pinch effect. The formation of an air gap reduces the variation in the electrical fuse resistance after cutting and makes it possible to attain a giga-ohm order resistance, thereby reducing the load on the decision circuit and allowing downsizing of the decision circuit.

In addition, as a result of the formation of an air gap, both the metal silicide film and polysilicon film are cut and even after the high-temperature storage test, there is no significant change in electrical fuse resistance, leading to improvement in reliability.

Second Embodiment

In the description of the first embodiment, it has been pointed out that the position of the air gap formed in the molten metal silicide depends on the current value (current density) and the air gap is formed more away from the center of the electrical fuse as the current value is smaller. This characteristic is utilized as follows in a semiconductor device in which electrical fuses are arranged in a given pattern.

Figure 19:
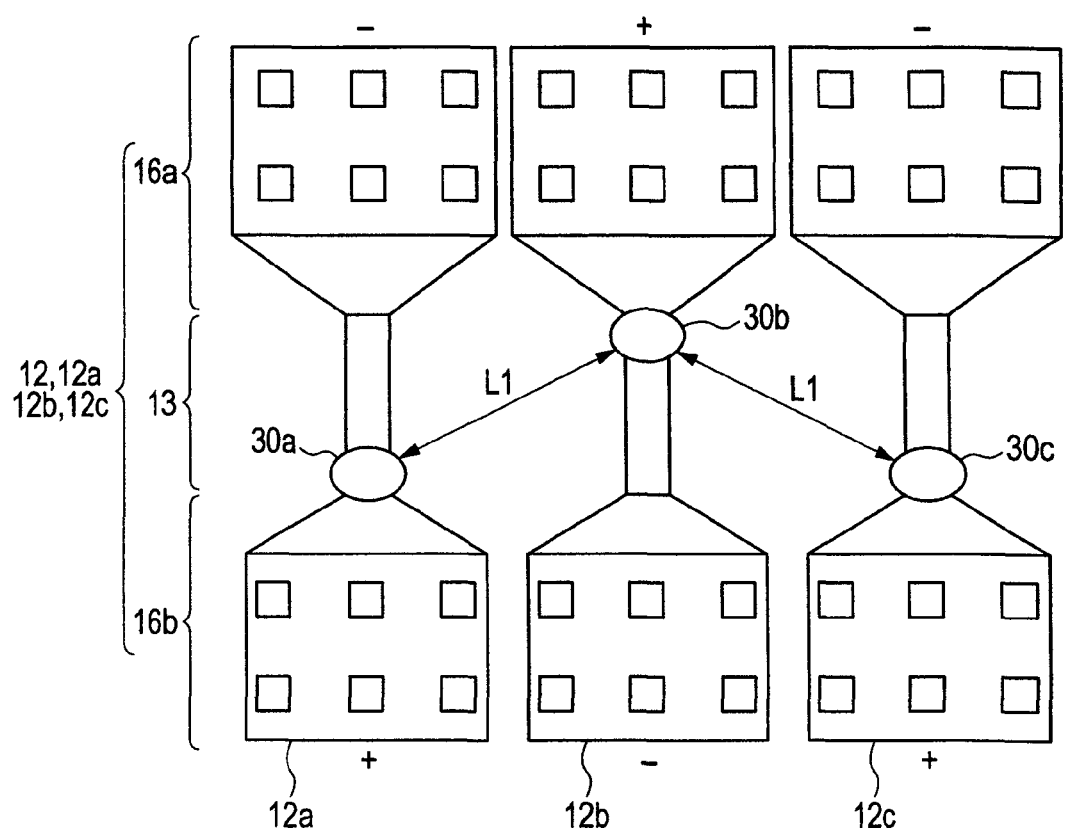
FIG. 19 is a fragmentary plan view showing the positional arrangement of electrical fuses in a semiconductor device according to a second embodiment of the invention.

As shown in FIG. 19, in the semiconductor device, a plurality of electrical fuses 12a, 12b, and 12c are spaced and arranged in a direction virtually perpendicular to the longitudinal direction in which current flows. The polarities of the voltages applied to the mutually adjacent electrical fuses 12a, 12b, and 12c are alternated. Furthermore, the current density used to cut the electrical fuses 12a, 12b, and 12c is set to a certain relatively low current density within the current density range in which an air gap can be formed.

In the above semiconductor device, when air gaps are formed in mutually adjacent electrical fuses, the air gap formed in one electrical fuse is spaced from the air gap formed in the other electrical fuse, so the electrical fuse reliability is assured. Why this assures reliability is explained below by comparison with comparative examples.

Figure 20:
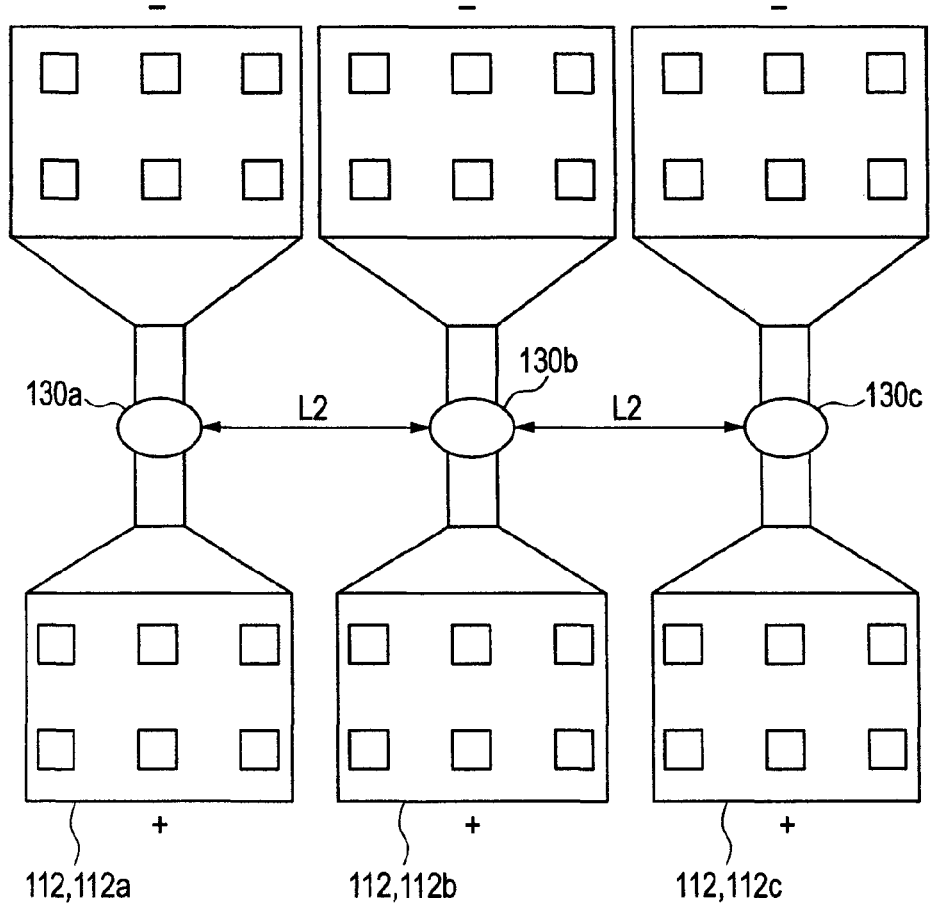
FIG. 20 is a fragmentary plan view showing the positional arrangement of electrical fuses in a semiconductor device according to a first comparative example.

First, in a semiconductor device according to a first comparative example as shown in FIG. 20, a plurality of electrical fuses 112 (112a, 112b, and 112c) are spaced and arranged in a direction virtually perpendicular to the longitudinal direction in which current flows. The mutually adjacent electrical fuses 112a, 112b, and 112c are arranged in a way that the polarity of the voltage applied to one electrical fuse is oriented in the same way as the polarity of the voltage applied to an electrical fuse adjacent to it. Furthermore, the current density used to cut the electrical fuses 112a, 112b, and 112c is set to a relatively high current density within the current density range in which an air gap can be formed.

In this case, the time from when current begins to flow until the metal silicide film melts is relatively short and an air gap is formed in the vicinity of the center of each of the electrical fuses 112a, 112b, and 112c. When air gaps are formed in the mutually adjacent electrical fuses (112a, 112b, and 112c), the distance L2 between the air gap formed in one electrical fuse and that in the other electrical fuse is substantially equal to the distance between the electrical fuses (112a, 112b, and 112c), which may deteriorate the reliability of the electrical fuses 112.

Figure 21:
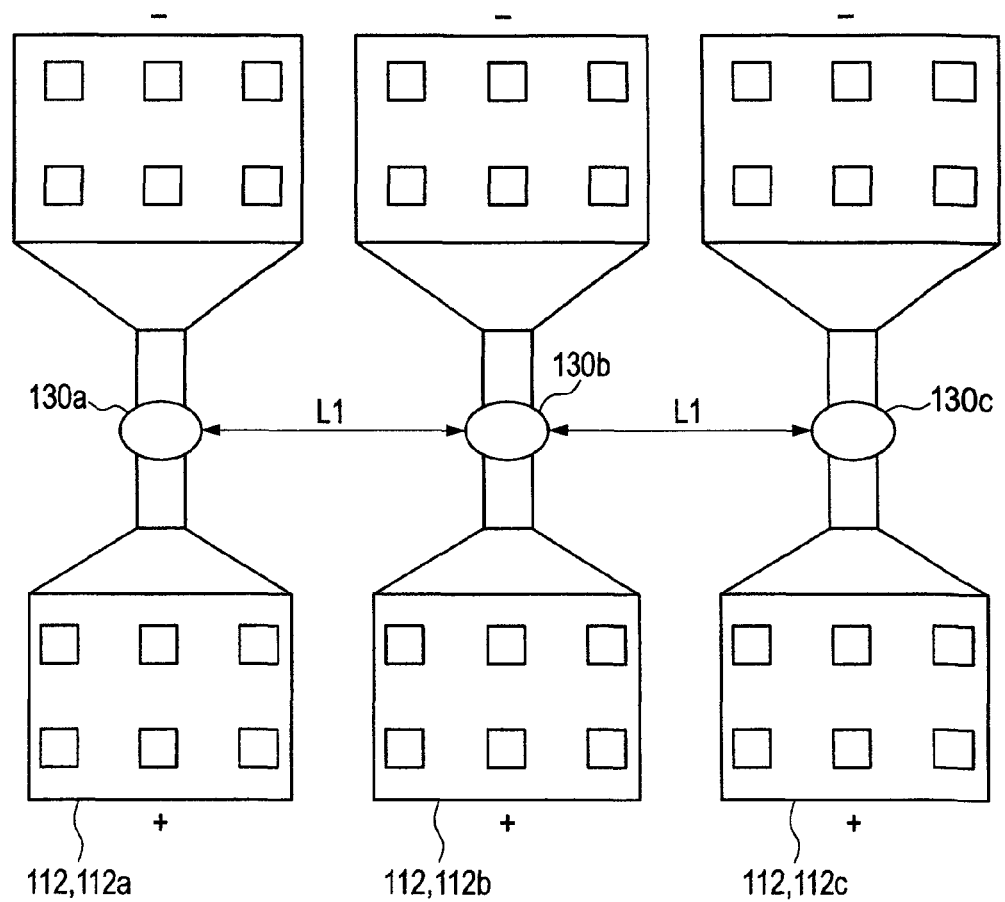
FIG. 21 is a fragmentary plan view showing the positional arrangement of electrical fuses in a semiconductor device according to a second comparative example.

On the other hand, in order to increase the distance L2 between the air gaps in this fuse arrangement to L1, the spacing between mutually adjacent electrical fuses (112a, 112b, and 112c) must be increased as in a semiconductor device according to a second comparative example shown in FIG. 21, so the area occupied by the electrical fuses 112 should be larger.

By contrast, in the case of the electrical fuses of the semiconductor device according to the second embodiment, since the current density used to cut the electrical fuses 12a, 12b, and 12c is set to a certain relatively low current density within the current density range in which an air gap can be formed, air gaps, if any, are formed at the positive pole side ends of the electrical fuses 12. Furthermore, the polarities of the voltages applied to the electrical fuses 12a, 12b, and 12c are alternated so that the positive pole side of one fuse (where an air gap is formed) is at one end of the longitudinal side and the positive pole side of a fuse adjacent to it is at the other end. This means that when an air gap is formed in each of mutually adjacent electrical fuses 12, the distance L1 between the air gap in one electrical fuse and the air gap formed in the other electrical fuse is maximized and the reliability of the electrical fuses 12 is thus improved.

Figure 22:
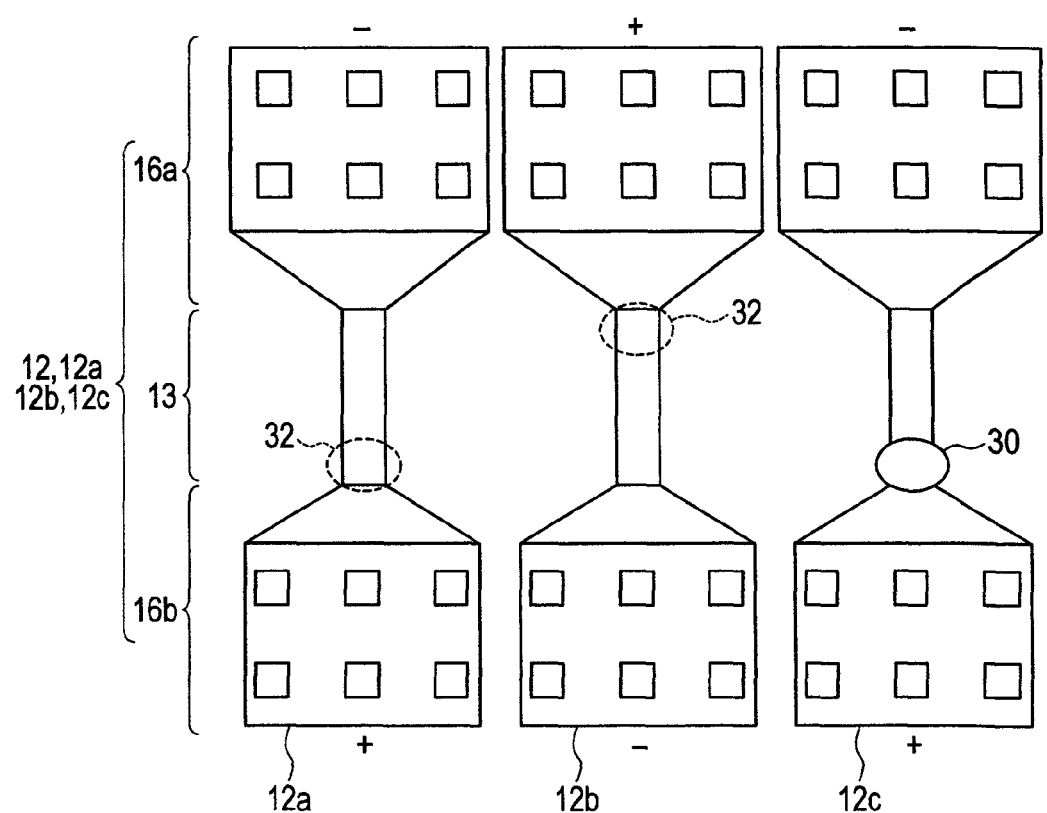
FIG. 22 is a fragmentary plan view showing the positional arrangement of electrical fuses in a variation of the second embodiment.

In the above explanation of the semiconductor device according to the second embodiment, in order to illustrate the influence of the distance between air gaps, it is assumed that the mutually adjacent electrical fuses (12a, 12b, and 12c) are all cut. Actually, however, both the adjacent electrical fuses may not be cut because the electrical fuses are cut according to the test results. For example, there is a case as shown in FIG. 22 that the electrical fuse 12c as one of mutually adjacent fuses has been cut at a molten part 30 and the other electrical fuse 12b has not been cut (non-molten part 32). In other words, the fuses 12 include both the cut electrical fuse 12c and the non-cut electrical fuses 12a and 12b.

Third Embodiment

An example of the method for manufacturing the semiconductor device with an electrical fuse according to the first embodiment or second embodiment will be described below.

Figure 23:
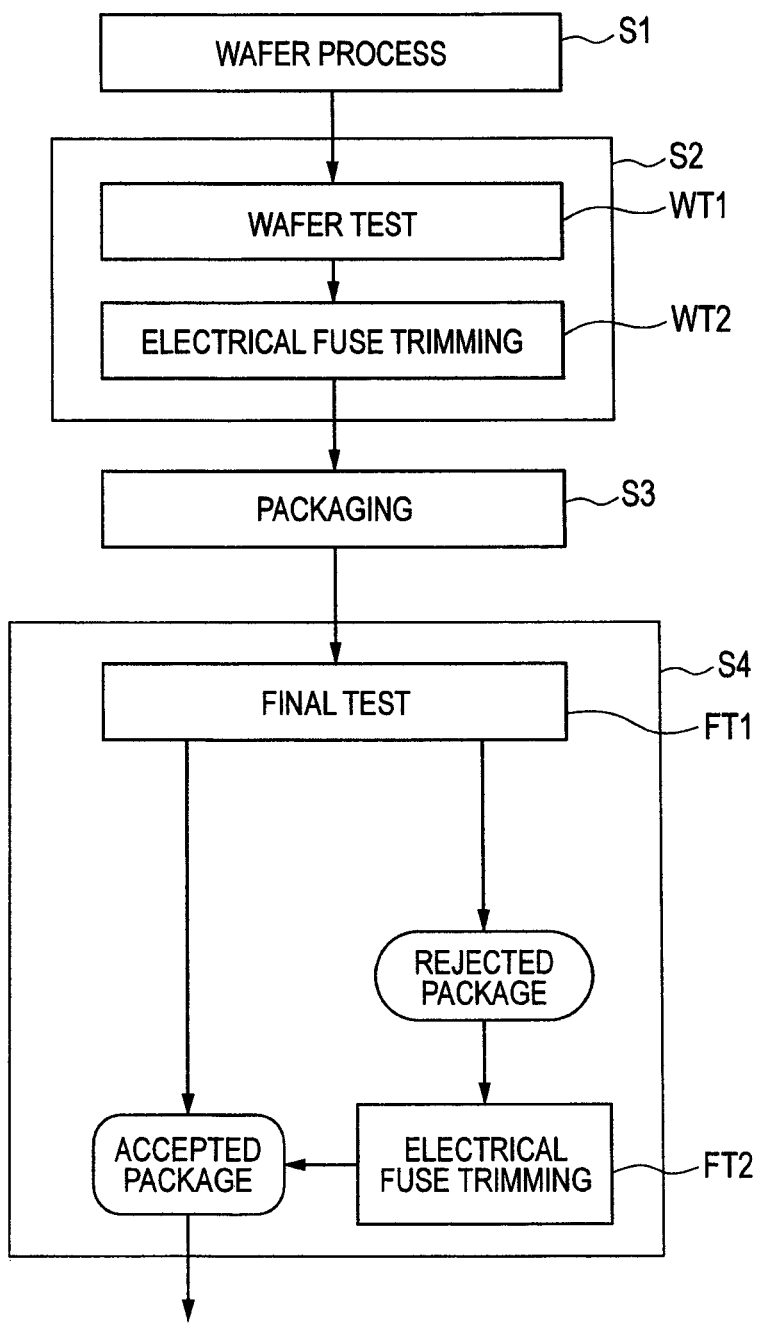
FIG. 23 is a flowchart showing the method for manufacturing a semiconductor device according to a third embodiment of the invention.

As shown in FIG. 23, first, a prescribed wafer processing procedure is carried out on the main surface of a semiconductor substrate (wafer) at Step S1 to form an internal circuit including, for example, a central processing unit and a memory, and a trimming circuit for trimming the internal circuit. In the trimming circuit, an electrical fuse is formed by performing a given etching process on the multi-layer film, including a polysilicon film and a metal silicide film such as a tungsten silicide film, which is formed over the main surface of the semiconductor substrate.

Next, at Step S2, the wafer is subjected to wafer test WT1 and electrical fuse trimming WT2. In wafer test WT1, each of the plural semiconductor devices (chips) formed on the wafer is checked to see whether it meets prescribed characteristic requirements. Among the semiconductor devices decided in this test to have failed to meet the requirements, those which can be repaired by trimming are repaired by cutting a specific electrical fuse by electrical fuse trimming WT2.

Next, at Step S3, each semiconductor device as a chip obtained by dicing the wafer is sealed with mold resin (packaging). Next, at Step S4, the package is subjected to final test FT1 and electrical fuse trimming FT2. In the final test FT1, the semiconductor device is checked to see whether it provides the required functionality as a product. Among the packages decided in this test to have failed to provide the required functionality (rejected packages), those which can be repaired by trimming are repaired by cutting a specific electric fuse by electrical fuse trimming FT2, and the packages thus repaired are accepted as products. Thus, finished semiconductor devices are obtained.

In the above semiconductor device manufacturing method, an air gap is formed in an electrical fuse by electromigration and a pinch effect during the electrical fuse trimming WT2 and FT2 processes. As explained earlier, this ensures that the electrical fuse is cut in a reliable manner and also guarantees the reliability of the electrical fuse after cutting.

Furthermore, since an electrical fuse is cut by applying electrical current to it, trimming can be performed whether the semiconductor device is in an on-wafer state or in a packaged state. Therefore, even after the molding step, the semiconductor device can be repaired onsite or after a burn-in test, contributing to improvement in productivity. Also by combining this type of electrical fuse with BIST (Built In Self Test), the cost of a self-repair test can be reduced.

Furthermore, in the case of an electrical fuse, since trimming can be performed by applying current immediately after a test using a tester, another trimming step or a special laser trimming device is not required unlike the method which uses laser light to cut a fuse. Moreover, in the method which uses laser light to cut a fuse, an opening to expose the fuse must be provided and thus a relatively large wiring-prohibition area in which wiring must not be made is required. Therefore, in that case it is difficult to provide an area pad. By contrast, in the case of an electrical fuse, it is unnecessary to provide such an opening, so the wiring prohibition area is smaller and it is easier to provide an area pad.

In the above semiconductor device manufacturing method, trimming with an electrical fuse is performed in both the wafer test and final test. However, it may be performed only in either of the tests, which contributes largely to improvement in the yield of semiconductor devices particularly in the sense that it can be performed in the final test after packaging.

The semiconductor device according to the present invention may be a combination of semiconductor devices according to the above embodiments and if that is the case, the combined effects of these embodiments can be achieved.

The embodiments disclosed herein are illustrative and not restrictive. The scope of the present invention is defined by the appended claims rather than by the description preceding them, and all changes that fall within metes and bounds of the claims, or equivalence of such metes and bounds are therefore intended to be embraced by the claims.

The present invention can be used effectively for an electrical fuse of a semiconductor device which adopts a polysilicon film and a metal silicide film as interconnect wiring materials.

What is claimed is:
1. A semiconductor device comprising:
a semiconductor substrate;
a first insulating film formed over the semiconductor substrate;
a first electrical fuse formed over the first insulating film, the first electrical fuse having a first polysilicon film and a first metal silicide film formed over the first polysilicon film;
a second electrical fuse formed over the first insulating film, the second electrical fuse having a second polysilicon film and a second metal silicide film formed over the second polysilicon film; and
a second insulating film formed over the first electrical fuse and the second electrical fuse,
wherein the first electrical fuse and the second electrical fuse are cut when a prescribed electric current is applied,
wherein, in the first electrical fuse, both the first metal silicide film and the first polysilicon film are cut and, in the second electrical fuse, neither the second metal silicide film nor the second polysilicon film is cut,
wherein a first end of the first electrical fuse is connected to a first positive pole,
wherein a second end of the first electrical fuse is disposed on an opposite end of the first end,
wherein, in the first electrical fuse, the prescribed electric current flows from the first end to the second end,
wherein in the first electrical fuse is cut in a first position by electromigration,
wherein a first length between the first posoition and the first end is shorter than a second length between the first position and the second end, and
wherein the first position at which the first electrical fuse is cut is where the first metal silicide film is melted by the electromigration, thereby to form an air gap.

2. The semiconductor device according to claim 1, wherein a size of the air gap is between 200 nm and 1 μm.

3. The semiconductor device according to claim 1, wherein, in a region adjacent to the air gap, the first metal silicide is formed throughout the first electrical fuse from a lower surface of the first electrical fuse to an upper surface of the first electrical fuse.

4. The semiconductor device according to claim 1, wherein the first electrical fuse has a first fuse pad, a second fuse pad and a first fuse body,
wherein the prescribed electric current flows along a first direction in plan view,
wherein the first position is disposed in the first fuse body,
wherein a fifth length of the first fuse pad in a second direction perpendicular to the first direction in plan view and a sixth length in the second fuse pad is longer than a seventh length of the first fuse body in the second direction in plan view,
wherein an eighth length of the first fuse body in the first direction is longer than the seventh length of the first fuse body in plan view.

5. The semiconductor device according to claim 1, the semiconductor device further comprising a third electrical fuse formed over the first insulating film,
wherein the prescribed electric current flows along a first direction in a plan veiw,
wherein the first electrical fuse, the second electrical fuse and the third electrical fuse are disposed along a second direction perpendicular to the first direction in the plan view,
wherein the third electrical fuse is cut when the prescribed electric current is applied,
wherein the third electrical fuse has a third polysilicon film and a third metal silicide film formed over the third polysilicon film,
wherein, in the third electrical fuse, both the third metal silicide film and the third polysilicon film are cut, wherein the third electrical fuse is cut in a second position, and wherein the second position is different from the first position in the first direction in the plan view.

6. The semiconductor device according to claim 5, wherein the third electrical fuse is adjacent to the first electrical fuse.

7. The semiconductor device according to claim 5, wherein a third end of the third electrical fuse is connected to a second positive pole, wherein the second positive pole is disposed on an opposite end of the first positive pole in the first direction in a plan view, wherein a fourth end of the third electrical fuse is disposed on an opposite end of the third end, and wherein a third length between the second position and the third end is shorter than a fourth length between the second position and the fourth end.

8. The semiconductor device according to claim 5, wherein the first electrical fuse, the second electrical fuse and the third electrical fuse have a plan pattern of linear symmetry with respect to a line segment which passes through a center of the plan pattern in the first direction.

9. The semiconductor device according to claim 8, wherein the first electrical fuse has contact parts formed at both ends in the first direction, wherein vias are formed over the each of the contact parts so as to be electrically connected to the contact parts, wherein the vias are linearly symmetrical with respect to the line segment.

* * * * *